United States Patent [19]
Basu

[11] Patent Number: 6,031,423
[45] Date of Patent: Feb. 29, 2000

[54] INPUT STAGE FOR RAIL-TO-RAIL INPUT OP AMP

[75] Inventor: Sudip Basu, Milpitas, Calif.

[73] Assignee: California Micro Devices, Inc., Milpitas, Calif.

[21] Appl. No.: 09/167,509

[22] Filed: Oct. 6, 1998

[51] Int. Cl.[7] ...................................................... H03F 3/45
[52] U.S. Cl. .......................................... 330/253; 330/257
[58] Field of Search .................................... 330/253, 255, 330/257, 258, 261

[56] References Cited

U.S. PATENT DOCUMENTS

| | | | |
|---|---|---|---|
| 5,734,297 | 3/1998 | Huijsing et al. | 330/253 |
| 5,789,982 | 8/1998 | Uscategui et al. | 330/255 |
| 5,801,564 | 9/1998 | Gasparik | 330/257 |

*Primary Examiner*—Robert Pascal
*Assistant Examiner*—Patricia T. Nguyen
*Attorney, Agent, or Firm*—Beyer & Weaver, LLP

[57] ABSTRACT

Methods and apparatus for providing a rail-to-rail op amp are disclosed. The rail-to-rail op amp includes a P-channel input stage and an N-channel input stage. The P-channel input stage includes a set of P-channel MOS transistors and the N-channel input stage includes a set of N-channel MOS transistors. The set of N-channel MOS transistors and the set of P-channel MOS transistors are capable of connecting to an inverting input and a non-inverting input. The op amp further includes a mirroring circuit adapted for sensing current flowing through the P-channel input stage and mirroring a portion of the sensed current. A threshold voltage reduction circuit is adapted for reducing the threshold voltage of the P-channel input stage in proportion to the mirrored current.

28 Claims, 6 Drawing Sheets

INPUT STAGE FOR RAIL-TO-RAIL INPUT OP AMP

BACKGROUND OF THE INVENTION

1. Field of the Invention

The present invention relates to operational amplifiers. More particularly, the present invention relates to input stages for rail-to-rail operational amplifiers.

Figure 1:
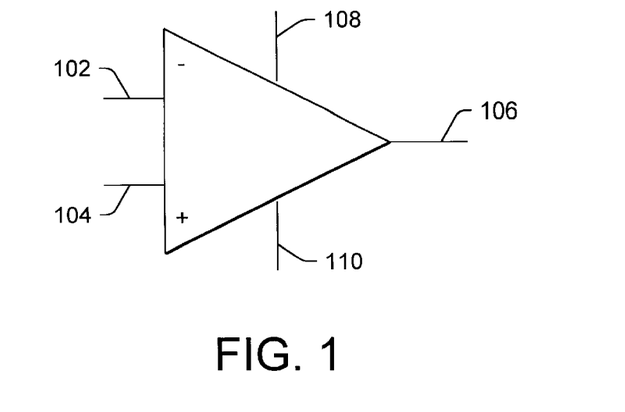
FIG. 1 is a diagram illustrating a standard op amp.

An operational amplifier (op amp) is typically used to provide high voltage gain, high input impedance, and low output impedance. As shown in FIG. 1, a standard op amp includes an inverting input 102, a noninverting input 104, and an output 106. The op amp is connected to a power supply via lead 108 as well as to a fixed voltage potential via lead 110 (e.g., ground). The op amp amplifies the voltage difference between the noninverting input 104 and the inverting input 102 to produce an output voltage at the output 106.

Figure 2:
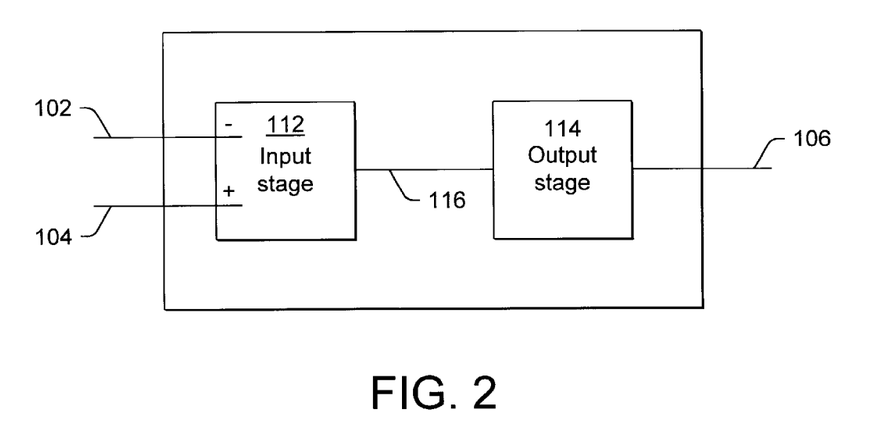
FIG. 2 is a general block diagram of the op amp of FIG. 1.

Referring next to FIG. 2, a general block diagram of the op amp of FIG. 1 is illustrated. As shown, an op amp typically includes an input stage 112 and an output stage 114. The input stage 112 is connected to the inverting input 102 and the noninverting input 104, and provides an output 116. The output stage 114 has an input coupled to the output of the input stage 112 and provides the output 106 of the op amp.

One primary goal in circuit design is minimizing power consumption. Moreover, digital circuits typically require low supply voltages. Thus, it is desirable to design op amps that can function at these low supply voltages.

Figure 3:
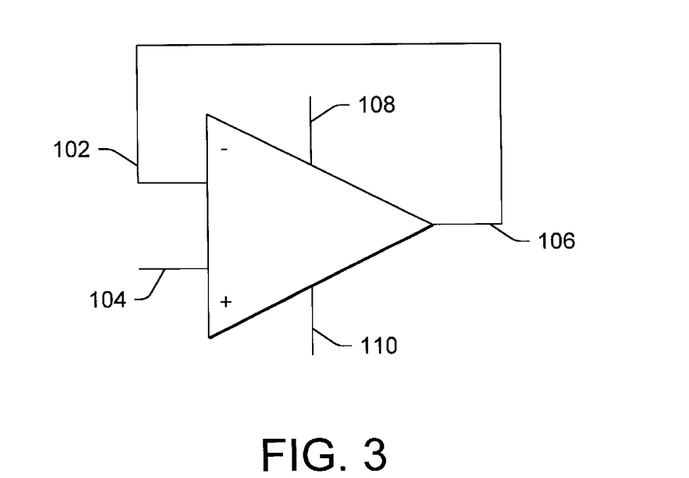
FIG. 3 is a diagram illustrating an op amp configured in the unity gain follower mode.

In general, the primary limit on reducing the supply voltage is the input stage of the op amp. Accordingly, it would be beneficial if an input stage were designed which would permit a reduced supply voltage to be utilized. However, the design of the op amp typically varies according to the desired mode of operation. By way of example, one common use of an amplifier is connecting the amplifier in a unity gain follower mode. FIG. 3 illustrates an op amp configured in the unity gain follower mode. As shown, the input 102 is connected to the output 106 of the op amp. As a result, the potential at the output 106 of the op amp will be identical to the input 104 of the op amp. In this mode, therefore, it is desirable that both the inputs 102, 104 and the output 106 of the op amp reach the maximum power supply voltage, providing a "rail-to-rail" swing. However, typically most op amps are not capable of producing a rail-to-rail input and output swing. That is, the inputs and output may reach a voltage that is less than the supply voltage.

2. Description of the Related Art

Figure 4A:
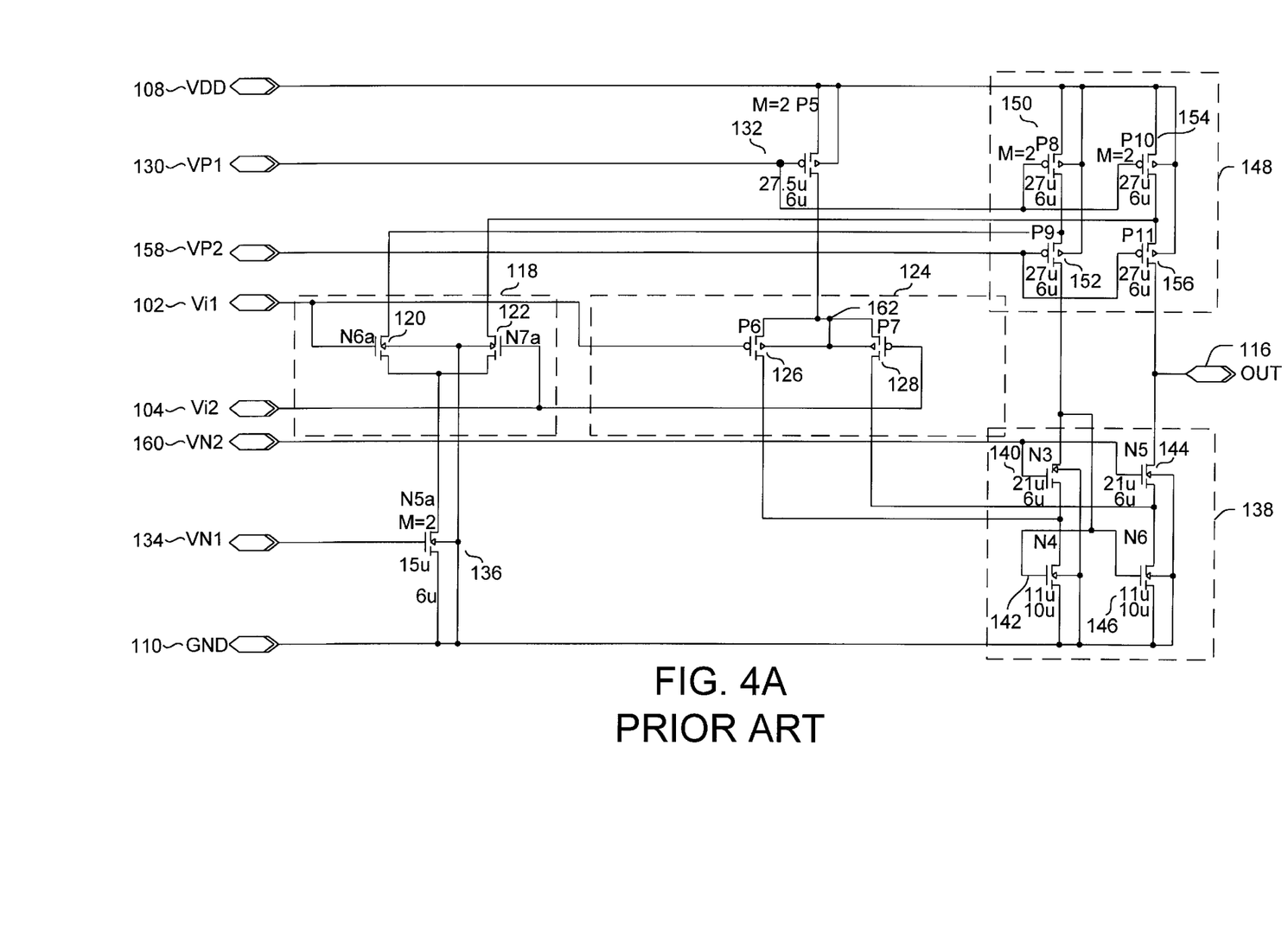
FIG. 4A is a prior art schematic illustrating a conventional CMOS op amp having two input stages.

To create a rail-to-rail swing, two input stages are typically utilized. Referring to FIG. 4A, a prior art schematic of a conventional CMOS op amp having two input stages is illustrated. As shown, an N-channel input stage 118 includes N-channel MOS transistors 120, 122 and a P-channel input stage 124 includes P-channel MOS transistors 126, 128. A bias voltage 130 is provided to bias transistor 132 which provides a bias current for the P-channel transistors 126, 128. Similarly, a bias voltage 134 is provided to bias transistor 136 which provides a bias current for the N-channel MOS transistors 120, 122. In addition, a first cascode stage 138 is provided for the first input stage 124. The first cascode stage 138 may include four NMOS transistors 140, 142, 144, 146. Similarly, a second cascode stage 148 is provided for the second input stage 118. The second cascode stage 148 may include four PMOS transistors 150, 152, 154, 156. The cascode stages 138, 148 each provide a gain to the corresponding input stage. A bias voltage 158 is provided to the second cascode stage and a bias voltage 160 is provided to the first cascode stage. The bias voltages 130, 134, 158, 160 may be generated internally to the op amp, external to the input stage, and may include a constant DC voltage.

If only the P-channel input stage 124 were present, the input voltage 102 would not reach the supply voltage 108. By way of example, as the input 102 increases and approaches the supply, the gate of the P-channel MOS transistor 126 also approaches the supply. In order for the P-channel transistor 126 to turn on, the difference in potential between the gate and the source $|V_{gs}|$ must be greater than the threshold voltage $V_{th}$. In other words, the source voltage must be greater than the sum of the input voltage 102 and the threshold voltage $V_{th}$. By way of example, for a supply voltage of 5 volts, when the input 102 is 4 volts, the voltage at the source 162 of the transistor 126 must be greater than the sum of the voltage at the input 102 and the gate of the transistor $V_g$ 126, 4 volts, and the threshold voltage (e.g., 0.8 volts). In this example, the voltage at the source 162 is at least 4.8 volts. Thus, there exists approximately 0.2 volts between the source 162 and the power supply 108. Moreover, when the input 102 reaches 4.2 volts, the voltage at the source 162 will reach 5 volts. As a result, the input voltage 102 cannot reach 5 volts. Accordingly, rail-to-rail operation cannot be achieved with only a P-channel input stage 124.

Through the addition of the N-channel input stage 118, rail-to-rail operation may be achieved. With both input stages 118, 124, the input can reach the supply voltage since the N-channel input stage 118 will be on when the P-channel input stage 124 is off. In order to turn an N-channel MOS transistor on, $V_g-V_s$ must be greater than $V_t$. Similarly, in order to turn a P-channel MOS transistor on, $V_s-V_g$ must be greater than $V_t$. Thus, as the input voltage 102 or 104 increases, the voltage at the gate of the corresponding transistors increases. As the voltage at the gate increases, the P-channel transistor will turn off while the N-channel transistor will turn on. Similarly, when the gate voltage decreases, the P-channel transistor turns on while the N-channel transistor turns off. By way of example, if the inputs 102, 104 are equal to $V_{dd}/2$, all the transistors will be on. The P-channel MOS transistor 126 turns off as the input voltage 102 increases, while the N-channel MOS transistor 120 turns on. Thus, when Vin 102 is equal to $V_{dd}$, the P-channel MOS transistor 126 turns off completely and the N-channel MOS transistor 120 remains on. Similarly, when $V_{in}$ 102 is equal to zero volts, the P-channel MOS transistor 126 remains on and the N-channel MOS transistor 120 turns off. Accordingly, through the use of the N-channel input stage transistors in combination with the P-channel input stage transistors, rail-to-rail operation may be achieved.

Although rail-to-rail operation may be achieved through the use of an op amp such as that illustrated in FIG. 4A, a supply voltage of approximately 3.3 volts is typically required. Moreover, today multiple voltage supplies are typically used to accommodate various circuitry. By way of example, a low voltage microprocessor may run at a voltage lower than 3.3 volts. It would be desirable, therefore, if an op amp were designed to function at such a reduced supply voltage $V_{dd}$. Such an op amp would provide reduced power consumption as well as operating costs. In addition, this would permit the use of a single voltage supply.

SUMMARY OF THE INVENTION

The present invention provides a rail-to-rail op amp that includes a P-channel input stage and an N-channel input stage. The op amp is operable at a reduced supply voltage which is accomplished through a reduction of the threshold voltage for the P-channel input stage. According to one embodiment, the threshold voltage $V_t$ is reduced through creating a negative bulk-source voltage $V_{bs}$, which may be obtained by subtracting the source voltage from the bulk voltage.

According to one embodiment, the threshold voltage is reduced through the use of a mirroring circuit and a threshold voltage reduction circuit. The mirroring circuit mirrors a portion of the current flowing through the P-channel input stage. The threshold voltage reduction circuit then creates a negative bulk-source voltage for the P-channel input stage that is proportional to the mirrored current. Thus, the negative bulk-source voltage is advantageously created when the P-channel input stage is on (e.g., when the inputs are low). This may be accomplished through modifying the voltage at the substrate in a non-linear manner during common mode operation of the op amp. However, the negative substrate-source voltage creates potentially damaging current through the substrate when the P-channel input stage is off (e.g., when the inputs are high). Thus, damaging current flowing through the substrate is reduced by increasing the voltage at the substrate when the current through the P-channel input stage decreases (e.g., when both inputs increase). In this manner, the present invention permits rail-to-rail operation at a reduced supply voltage while minimizing damaging current through the substrate.

The advantages of the present invention are numerous. The present invention permits a rail-to-rail op amp to operate at a reduced supply voltage. Thus, the op amp may be used in conjunction with digital circuitry that operates at this reduced voltage. Moreover, the op amp of the present invention provides the advantages of reduced power consumption and operating costs.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

An invention is described herein that provides a rail-to-rail op amp that includes a P-channel input stage and an N-channel input stage. The op amp is operable at a reduced supply voltage which is accomplished through a reduction of the threshold voltage for the P-channel input stage. According to one aspect, the threshold voltage $V_t$ is reduced through creating a negative bulk-source voltage $V_{bs}$. The bulk-source voltage $V_{bs}$ may be obtained by subtracting the source voltage from the bulk voltage.

According to one embodiment, the threshold voltage is reduced through the use of a mirroring circuit and a threshold voltage reduction circuit. The mirroring circuit mirrors a portion of the current flowing through the P-channel input stage. The threshold voltage reduction circuit then creates a negative bulk-source voltage for the P-channel input stage that is proportional to the mirrored current. Thus, the negative bulk-source voltage is advantageously created when the P-channel input stage is on (e.g., when the inputs are low). This may be accomplished through modifying the voltage at the substrate in a non-linear manner during common mode operation of the op amp. However, the negative substrate-source voltage creates potentially damaging current through the substrate when the P-channel input stage is off (e.g., when the inputs are high). Thus, damaging current flowing through the substrate is reduced by increasing the voltage at the substrate when the current through the P-channel input stage decreases (e.g., when both inputs increase). In this manner, the present invention permits rail-to-rail operation at a reduced supply voltage while minimizing damaging current through the substrate.

To further illustrate the features and advantages of the present invention, the minimum supply voltage required for an input stage configuration such as that illustrated in FIG. 4A may be determined for both the P-channel input stage and the N-channel input stage. When both inputs 102, 104 are at half the supply voltage, both the P-channel MOS transistors 126, 128 and the N-channel MOS transistors 120, 122 are typically on. Thus, for proper operation of both the N-channel input stage 118 and the P-channel input stage 124 input stages, the following equation should be satisfied for both input stages: $V_{dd}/2 = V_{t1} + V_{od1} + V_{dsmin3}$. Accordingly, the minimum supply voltage $V_{dd} = 2 * (V_{t1} + V_{od1} + V_{dsmin3})$.

Figure 4B:
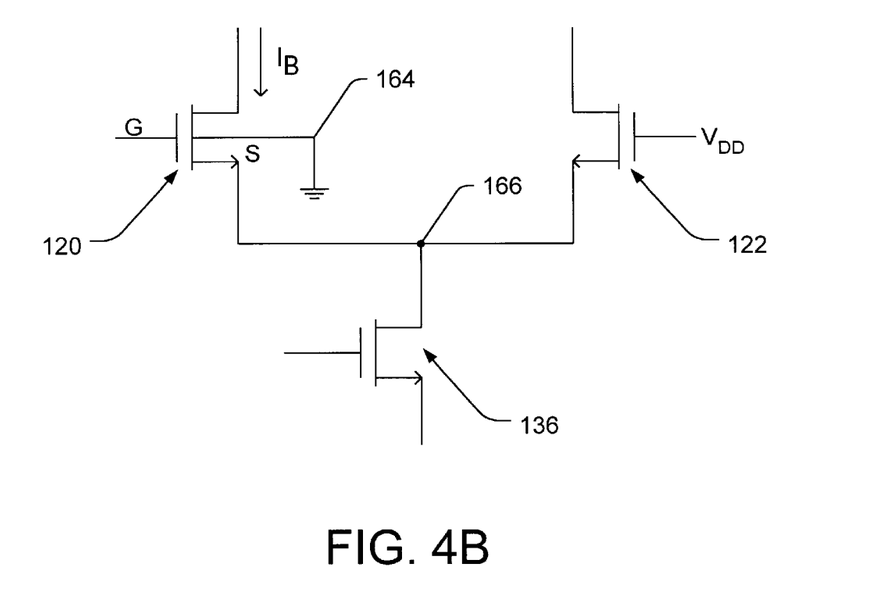
FIG. 4B is a circuit diagram illustrating the N-channel input stage transistors of FIG. 4A.

The N-channel input stage 118 may be considered separately from the P-channel input stage. FIG. 4B is a circuit diagram illustrating the N-channel input stage transistors of FIG. 4A. As shown, $V_{t1}$ is the threshold voltage of the transistor 120, $V_{od1}$ is the overdrive voltage required to turn the transistor 120 on, and $V_{dsmin3}$ is the drain-source voltage of the transistor 136. Accordingly, the minimum supply voltage required for the input stage configuration of FIG. 4A is proportional to the threshold voltage of the transistors used.

Figure 5:
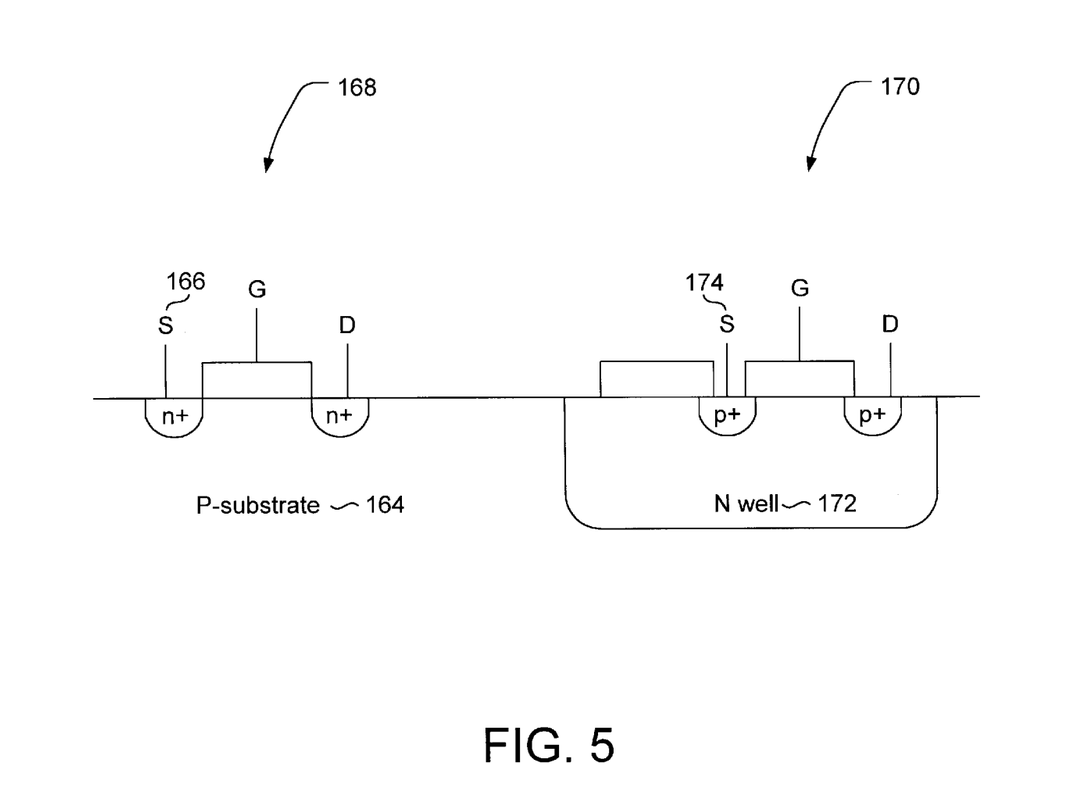
FIG. 5 is a diagram illustrating a cross-sectional view of an N-channel MOS transistor and a P-channel MOS transistor.

The threshold voltage $V_t$ of any MOS transistor depends on the voltage between the substrate or "bulk" 164 and the source 166 of the transistor. As shown in FIG. 5, a cross-sectional view of an N-channel MOS transistor 168 and a P-channel MOS transistor 170 is shown. The N-channel MOS transistor 168 includes N-channels in a P-substrate. As described above, $V_{gs}$ must be greater than $V_t$. The threshold voltage $V_t$ of any transistor depends on the voltage between the source and the bulk of the transistor as provided by the following equation:

$$V_{t1}=V_{t0}+((\sqrt{2\Phi_F+V_{SB}}-\sqrt{2\Phi_F}))$$

where $V_{t0}$ is the threshold voltage Vth when there is no voltage differential between the source and the bulk, $\Phi_F$ is a constant indicating the surface potential, and (is a constant indicating the body factor. The P-substrate 164 must be connected to ground while source 166 is connected to a voltage potential. Therefore, $V_{sb}$ will not be equal to zero for the N-channel input stage transistors. As a result, the threshold voltage $V_{t1}$ will be greater than $V_{t0}$ and will increase the requirement for the minimum voltage supply $V_{dd}$.

The supply voltage $V_{dd}$ and the threshold voltage may be determined in a similar manner for the P-channel input stage. As shown, the N-well substrate 172 is floating and therefore may be connected to the source 174. Therefore, $V_{sb}$ may equal zero. As a result, the threshold voltage may be reduced which will provide a corresponding reduction in the requirement for the minimum voltage supply $V_{dd}$.

Since the op amp includes both a P-channel input stage and an N-channel input stage, the minimum supply voltage $V_{dd}$ that may be applied will be the average of the sum of the minimum supply voltages for both input stages. Since $V_{sb}$ cannot equal zero for the N-channel input stage, the threshold voltage and corresponding $V_{dd}$ will be greater than that of the P-channel input stage. As described above, the supply voltage $V_{dd}$ for the P-channel input stage may be minimized through forcing $V_{sb}$ equal to zero. However, it would be desirable if the supply voltage could be further reduced.

The supply voltage required by a rail-to-rail op amp may be reduced through reducing the threshold voltage $V_t$ for selected transistors. Although it is not possible to reduce the threshold voltage of the N-channel MOS transistors, the threshold voltage of the P-channel MOS transistors may be reduced. Accordingly, one method for minimizing the supply voltage is through reducing the threshold voltage for the P-channel input stage. One method for reducing the threshold voltage $V_t$ is creating a negative substrate bias voltage. In other words, a negative bulk-source voltage $V_{bs}$ may be created. The bulk-source voltage $V_{bs}$ may be obtained by subtracting the source voltage from the bulk voltage. It would be desirable, therefore, to provide a P-channel input stage that utilizes a negative bulk-source voltage $V_{bs}$.

Figure 6A:
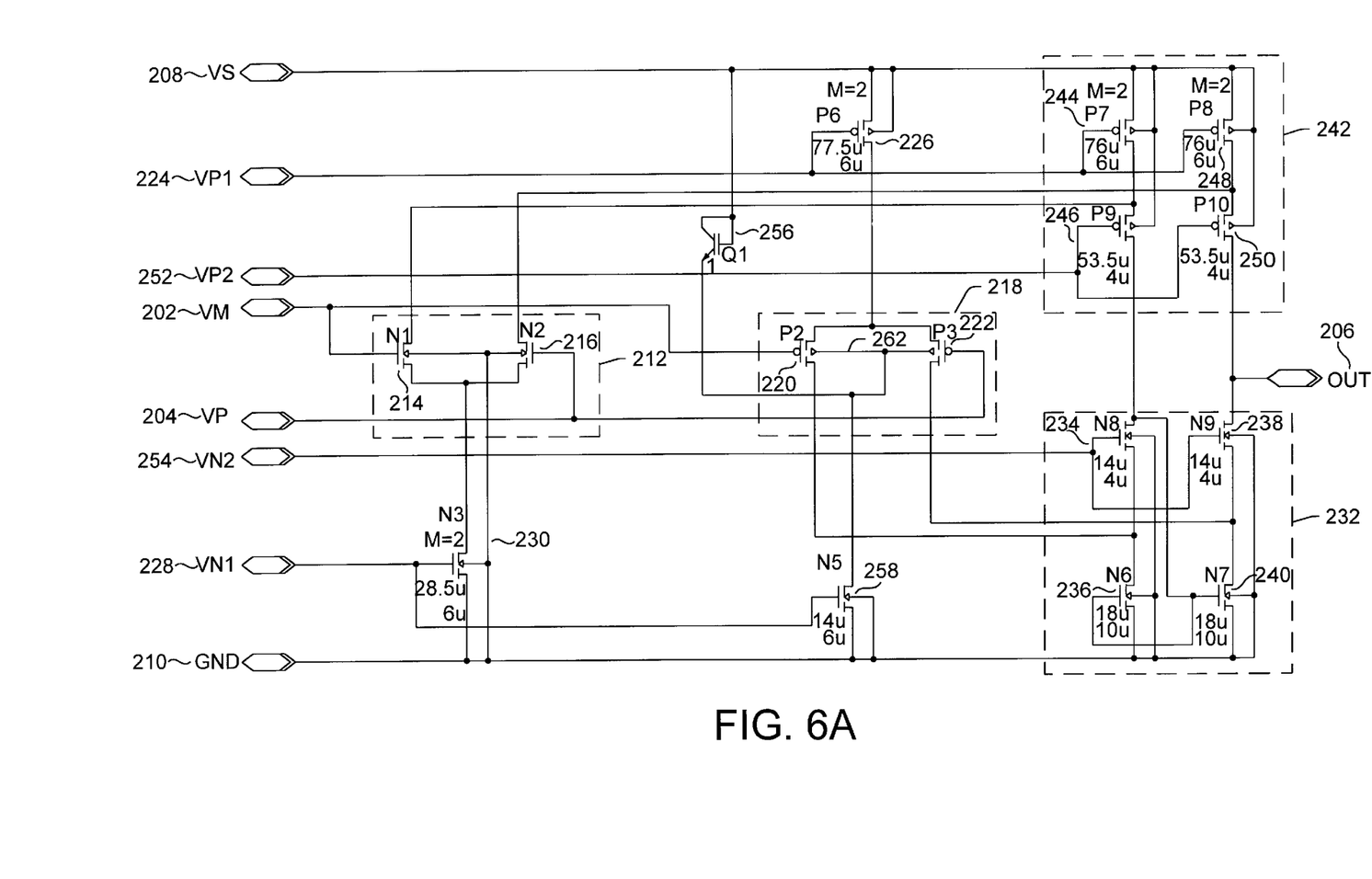
FIG. 6A is a block diagram illustrating an input stage configuration for a rail-to-rail op amp according to one embodiment of the invention.

Referring next to FIG. 6A, an input stage configuration for a rail-to-rail op amp according to one embodiment of the invention is illustrated. The op amp includes an inverting input 202, a non-inverting input 204, and an output 206. The op amp is connected to a power supply 208 as well as to a fixed voltage potential 210 (e.g., ground). As shown, an N-channel input stage 212 includes a set of N-channel input driver transistors 214, 216 and a P-channel input stage 218 includes a set of P-channel input driver transistors 220, 222. The set of N-channel input driver transistors includes a first N-channel MOS transistor 214 and a second N-channel MOS transistor 216. In addition, the set of P-channel input driver transistors includes a first P-channel MOS transistor 220 and a second P-channel MOS transistor 222. Although the set of P-channel input driver transistors and the set of N-channel input driver transistors are each shown to include two transistors, an alternate number of transistors may be utilized. A first bias voltage 224 is provided to first bias transistor 226 that provides a bias current for the P-channel input stage transistors. Similarly, a second bias voltage 228 is provided to second bias transistor 230 that provides a bias current for the N-channel input stage transistors. In addition, a first cascode stage 232 is provided for the first input stage 212. The first cascode stage 232 may include four N-channel MOS transistors 234, 236, 238, 240. Similarly, a second cascode stage 242 is provided for the second input stage 218. The second cascode stage 242 may include four P-channel MOS transistors 244, 246, 248, 250. The cascode stages 232, 242 each provide a gain to the corresponding input stage. A third bias voltage 252 is provided to the second cascode stage 242 and a fourth bias voltage 254 is provided to the first cascode stage 232. The bias voltages 224, 228, 252, 254 may be generated internally to the op amp, external to the input stage, and may include a constant DC voltage.

In order to create a negative bulk-source voltage $V_{bs}$, a threshold voltage reduction circuit 256 is connected to the voltage supply 208 and the substrate of the P-channel input stage 218. In addition, a third bias transistor 258 is provided. The third bias transistor 258 provides a current source since the bias voltage 228 will force a constant current through the third bias transistor 258. The threshold voltage reduction circuit 256 is adapted for creating a voltage drop of between approximately 0 volts and approximately 0.7 volts. As shown, the threshold voltage reduction circuit 256 may include a bipolar NPN transistor. The cascode stages 232 and 242 may be implemented in one or more cascode stages, and may include load transistors or resistors, thereby providing a high voltage gain. The circuit is fabricated using a CMOS process with a P-base extension.

In common mode operation, both inputs increase and decrease simultaneously. As described above, when both inputs 202, 204 are close to $V_{dd}/2$, both the P-channel input stage and the N-channel input stage are on. However, as both inputs 202, 204 approach the supply voltage, the P-channel input stage will turn off.

Figure 6B:
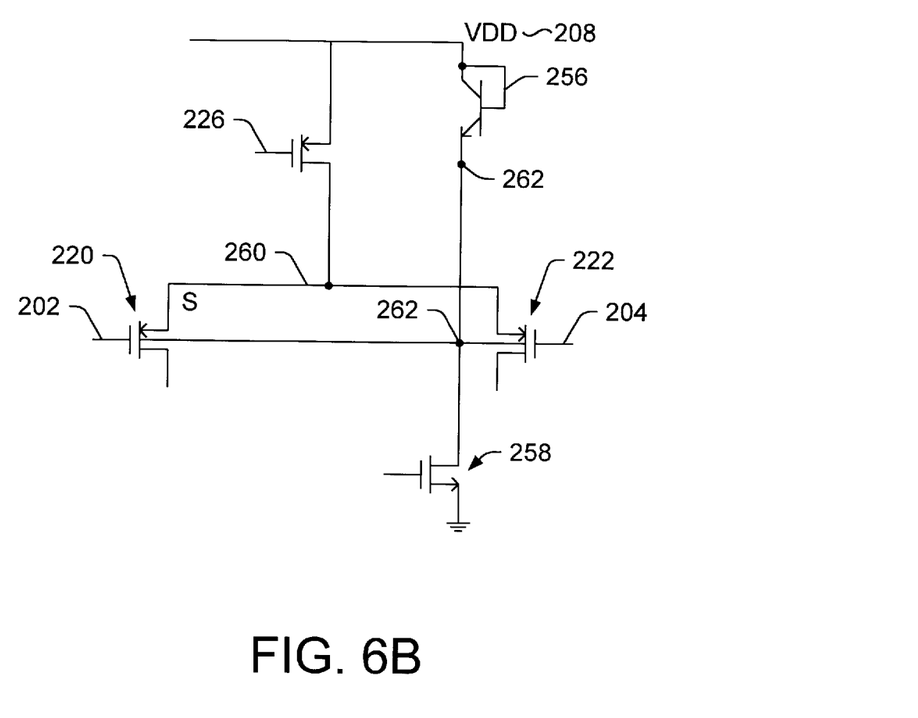
FIG. 6B is a diagram illustrating the P-channel input stage of FIG. 6A.

FIG. 6B illustrates a segment of the input stage of FIG. 6A that includes the P-channel input stage. In the following example, the supply voltage $V_{dd}$ is equal to 3.3 volts and both the inputs 202, 204 approach the supply voltage $V_{dd}$. When the inputs 202, 204 reach a voltage of 3 volts, the voltage at the gates of the P-channel MOS transistors 220, 222 will also equal 3 volts. At the same time, the voltage at the source 260 of the P-channel MOS transistors 220, 222 cannot exceed 3.3 volts. Since the voltage between the gate and the source Vgs of both the P-channel MOS transistors is not greater than the threshold voltage, both the P-channel MOS transistors 220 and 222 will turn off and the voltage at the source of the P-channel MOS transistors 260 will reach the supply voltage (e.g., 3.3 volts). Since the current source bias transistor 258 provides a constant current, a constant current will flow through the bipolar transistor 256. As a result, the bipolar transistor 256 will always have a base-emitter voltage Vbe of between approximately 0.6 and approximately 0.7 volts. As a result, the bipolar transistor 256 will always be on. In addition, the voltage at the substrate 262 will always be 0.7 volts less than the supply voltage. Thus, the voltage at the N-well substrate 262 will be 2.6 volts and the voltage at the source 260 will be 3.3 volts. Accordingly, the bipolar transistor 256 modifies the substrate voltage 262 of the P-channel MOS transistors, creating a negative bulk-source voltage Vbs.

Figure 7:
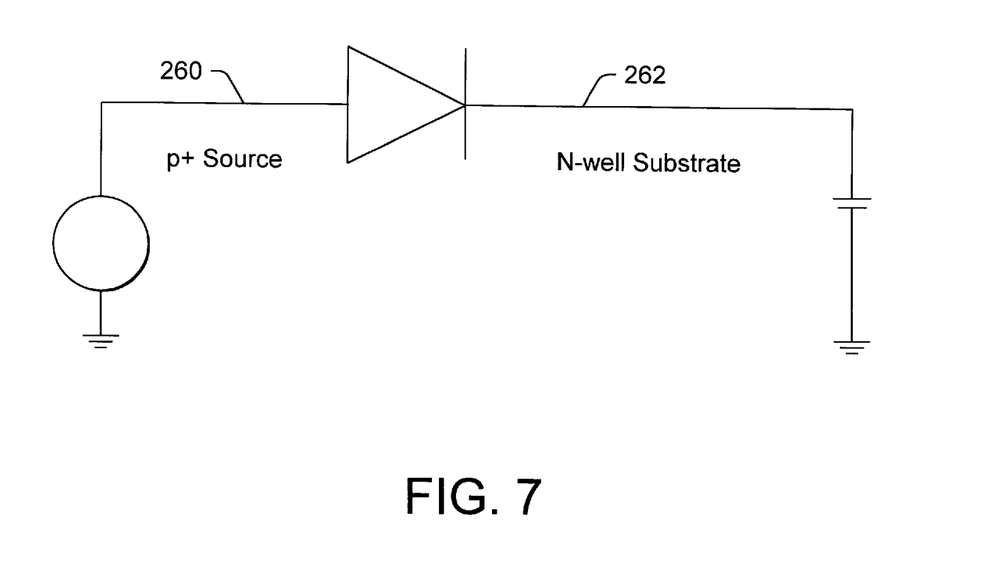
FIG. 7 is a diagram illustrating the equivalent circuit created by the negative bulk-source voltage $V_{bs}$ produced according to the embodiment shown in FIG. 6A.

Although a negative bulk-source voltage Vbs is desirable since this allows a lower supply voltage to be utilized, this voltage may also cause undesirable effects in the op amp as well as adjacent circuits. As shown in FIG. 7, the equivalent circuit created by this negative bulk-source voltage $V_{bs}$ is a diode between the source 260, having a voltage equal to the supply voltage 3.3 volts, and the substrate 262, having a voltage equal to 2.6 volts. As a result, the diode will be completely turned on, providing an overdrive voltage $V_{od}$ equal to 0.7 volts. Thus, there will always be a 0.7 volt difference between the source 260 and the substrate 262. This voltage differential creates a dangerous high current from the source 260 to the substrate 262. This current may harm the op amp as well as adjacent circuitry. Thus, protective mechanisms such as guard bars should be used to prevent the destruction of the circuit fabricated in the n-well as well as adjacent circuits fabricated in the P-substrate. Although the threshold reduction circuit 256 provides a negative bulk-source voltage $V_{bs}$, this negative voltage may produce an undesirable destructive current. As described above, the fixed voltage of 0.7 volts provided by the bipolar transistor 256 is beneficially used to provide a negative $V_{bs}$ when the transistors 220, 222 are on. However, this fixed voltage creates a destructive current when the transistors 220, 222 are turning off. To generate a substantial current in the substrate, a voltage between the source 260 of the P-MOS transistors and the substrate 262 must be approximately 0.7 volts. Thus, it would be desirable to reduce the voltage across the bipolar transistor 256 (e.g., 0.3 volts). If the current through the P-channel MOS transistors 220, 222 could be sensed and used to modify the current through the bipolar transistor 256 this would reduce the voltage drop Vbe across the bipolar transistor 256 as the P-channel MOS transistors 220, 222 turn off. As the base-emitter voltage $V_{be}$ across the bipolar transistor 256 decreases, the voltage at the substrate 262 will increase. Thus, the bulk-source voltage $V_{bs}$ will decrease, resulting in less destructive substrate current and minimizing the destruction of the circuitry.

Figure 8:
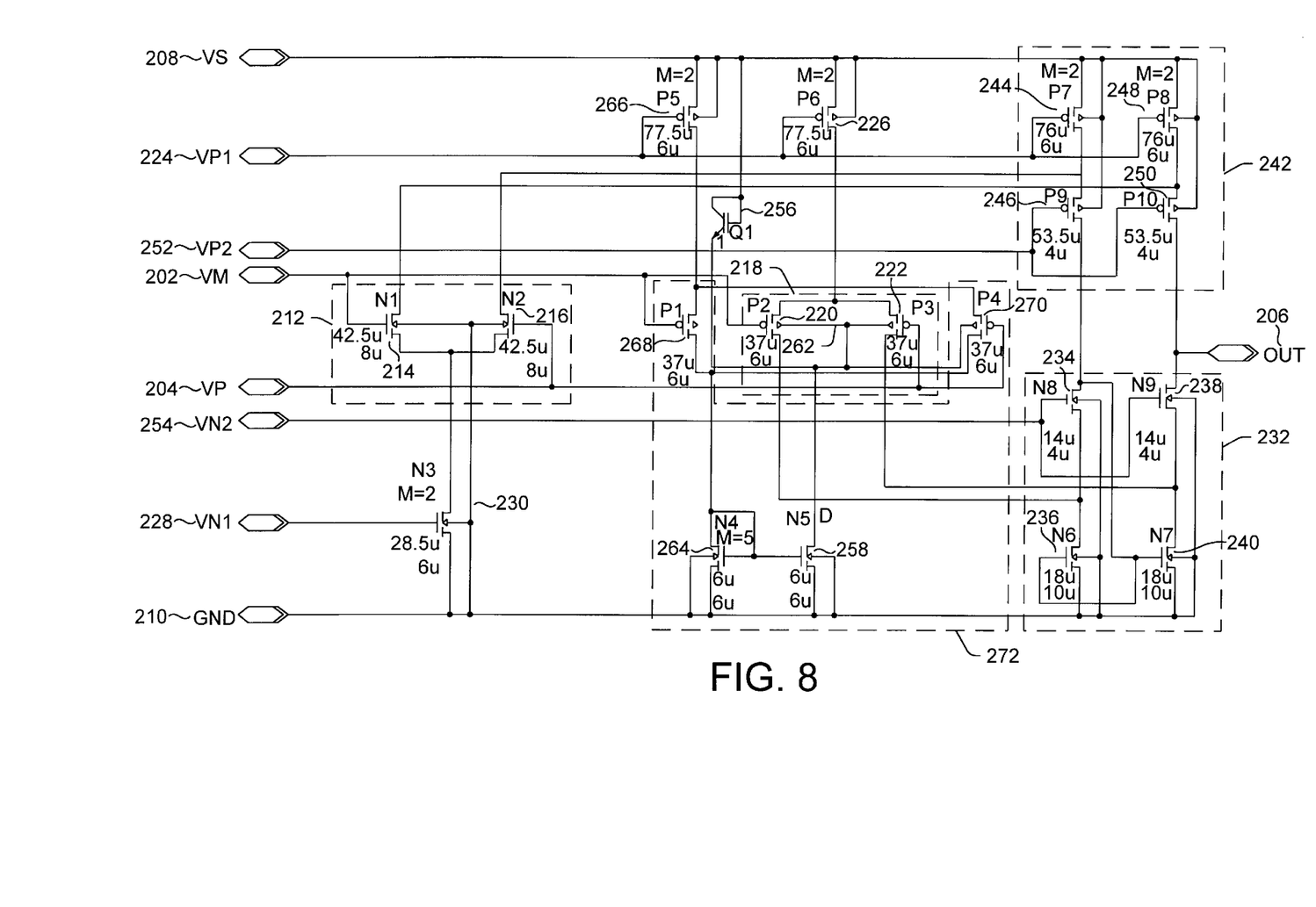
FIG. 8 is a circuit diagram illustrating an input stage for a op amp according to another embodiment of the invention.

FIG. 8 is a circuit diagram illustrating an input stage for an op amp according to another embodiment of the invention. In addition to the configuration illustrated in FIG. 6A, the input stage further includes a P-channel input stage mirroring transistor 264, a bias transistor 266, a first current mirroring transistor 268, and a second current mirroring transistor 270. Thus, a mirroring circuit 272 may include the current mirroring transistors 268, 270, the mirroring transistor 264, and the bias transistor 258. The mirroring transistor 264 may include an N-channel MOS transistor, the bias transistor 266 may include a P-channel MOS transistor, and the current mirroring transistors 268, 270 may include P-channel MOS transistors. Since the source of the bias transistors 226, 266 is connected to the supply voltage 208 and the gate of the bias transistors 226, 266 is connected to the bias voltage 224, the gate-source voltage $V_{gs}$ will be identical and the bias transistors 226, 266 will provide equivalent current. As shown, the sources and drains of the current mirroring transistors 268, 270 are connected. The first input 202 is connected to the gate of the first current mirroring transistor 268 and the gate of the first P-channel MOS transistor 220. Similarly, the second input 204 is connected to the gate of the second current mirroring transistor 270 and the gate of the second P-channel MOS transistor 222. In addition, the drain of the mirroring transistor 264 is connected to the drain of the current mirroring transistors 268, 270. The bias transistor 258 may be implemented as an N-channel MOS transistor. As shown, the bias transistor 258 has an input coupled to the mirroring transistor 264 and an output coupled to the substrate of the current mirroring transistors 268, 270 and the P-channel MOS transistors 220, 222. By way of example, the drain of the bias transistor 258 is connected to the substrate 262 of the P-channel MOS transistors 220, 222 and the substrate 262 of the current mirroring transistors 268, 270. In addition, the substrate 262 is connected to the emitter of the bipolar transistor 256.

The mirroring circuit 272 is adapted for sensing current flowing through the P-channel input stage and mirroring a portion of the sensed current. As described above, when the inputs 202, 204 are at a voltage equal to approximately $V_{dd}/2$, the P-channel MOS transistors 220 and 222 will be on. However, as the voltage at both the inputs 202, 204 increases in common mode, the current through the P-channel MOS transistors 220 and 222 will reduce slowly since the gate-source voltage $V_{gs}$ will be insufficient. Thus, the P-channel MOS transistors 220 and 222 will gradually turn off. At the same time, the current through the current mirroring transistors 268, 270 will also reduce since they are connected in parallel with the P-channel MOS transistors 220, 222. Since the $V_{gs}$ of the bias transistors 226, 266 is identical, they will provide equivalent constant current, and the voltage at the source of the current mirroring transistors 268, 270 will be identical to that of the P-channel input stage transistors 220, 222. In addition, since the inputs 202, 204 are connected to the gates of the current mirroring transistors 268, 270 as well as the P-channel MOS transistors 220, 222, the gate-source voltages $V_{gs}$ of the current mirroring transistors 268, 270 will be identical to that of the P-channel input stage transistors 220, 222 in common mode. Accordingly, since the gate-source voltages $V_{gs}$ are identical, the first current mirroring transistor 268 senses the current through the first P-channel MOS transistor 220 and the second current mirroring transistor 270 senses the current through the second P-channel MOS transistor 222. In this manner, the current mirroring transistors 268, 270 mirror the current through the P-channel MOS transistors 220, 222.

In addition to functioning in the common mode, the op amp must also be capable of functioning in the differential mode. However, in differential mode, since one input increases as the other input decreases, there is no damaging substrate current. This damaging substrate current is only present when both the inputs 202, 204 are increasing and both the P-input stage transistors 220, 222 are turning off.

In both the differential and common modes, the current I through the current mirroring transistors 268, 270 is added through the use of the P-channel input stage mirroring transistor 264. Thus, in common mode, 2I is mirrored by the P-channel input stage mirroring transistor 264. This current will be sensed by the bias transistor 258 since the gates of the bias transistor 258 and the mirroring transistor 264 are coupled. The bias transistor 258 may be a fraction of the size of the mirroring transistor 264. By way of example, if the bias transistor 258 is approximately ⅓ of the size of the mirroring transistor 264, the bias transistor 258 will mirror the current ⅔ I. As a result, the bias transistor 258 controls the current that flows through the bipolar transistor 256. In this manner, the current through the bipolar transistor 256 is controlled. Accordingly, the threshold voltage reduction circuit 256 reduces the threshold voltage of the P-channel input stage in proportion to the mirrored current.

By way of example, in common mode, when the inputs 202, 204 increase, the P-channel MOS transistors 220 and 222 will turn off, and the current mirroring transistors 268, 270 will turn off. As a result, the current through the P-channel input stage mirroring transistor 264 will be zero and the current through the bias transistor 258 will be zero. In this manner, the decreasing current flowing through the P-channel input stage transistors 220, 222 is sensed and this current is mirrored through the bipolar transistor 256. Since the current $I_c$ through the collector of the bipolar transistor 256 approaches zero, the voltage drop $V_{be}$ across the bipolar transistor 256 reduces in proportion to the mirrored current, which is proportional to $\log_e I_c$. Thus, the voltage across the bipolar transistor 256 is modified to track the common mode in a non-linear manner. As a result, the voltage at the substrate 262 will be higher and the bulk-source voltage $V_{bs}$ will be less, resulting in less substrate current.

As described above, in one embodiment, a mirroring circuit mirrors a portion of the current flowing through the P-channel input stage. A threshold voltage reduction circuit creates a negative substrate-source voltage for the P-channel input stage that is proportional to the mirrored current. This may be accomplished through modifying the voltage at the substrate in a non-linear manner during common mode operation of the op amp. By way of example, current flowing through the substrate is reduced by increasing the voltage at the substrate when the current through the P-channel input stage decreases (e.g., when both inputs increase). In this manner, the threshold voltage reduction circuit ensures that current through the substrate is proportional to the current flowing through the P-channel input stage.

The present invention provides a rail-to-rail op amp that is operable at a reduced supply voltage. This is accomplished through reducing the threshold voltage for the P-channel input stage. Moreover, the threshold voltage may be reduced without producing a damaging substrate current. According to one embodiment of the invention, a rail-to-rail op amp is operable at a supply voltage of approximately 2.4 volts which is lower than the 3.3 volts typically required. This permits the op amp to be used in conjunction with a microprocessor that functions at this reduced voltage. As a result, a single supply voltage may be provided for use by the op amp as well as low voltage circuitry. Moreover, the op amp of the present invention provides the advantages of reduced power consumption and operating costs.

Although illustrative embodiments and applications of this invention are shown and described herein, many variations and modifications are possible which remain within the concept, scope, and spirit of the invention, and these variations would become clear to those of ordinary skill in the art after perusal of this application. For instance, the present invention is described as including a threshold voltage reduction circuit and a mirroring circuit. Although the threshold voltage reduction circuit is illustrated as being implemented as a bipolar NPN transistor and the mirroring circuit is shown to include a pair of current mirroring transistors, a P-channel input stage mirroring transistor, and a bias transistor, it should be understood that the present invention is not limited to such an exemplary arrangement. Accordingly, the present embodiments are to be considered as illustrative and not restrictive, and the invention is not to be limited to the details given herein, but may be modified within the scope and equivalents of the appended claims.

What is claimed is:

1. A rail-to-rail op amp, comprising:
   a P-channel input stage including a set of P-channel MOS transistors;
   an N-channel input stage including a set of N-channel MOS transistors, the set of N-channel MOS transistors and the set of P-channel MOS transistors being capable of connecting to an inverting input and a non-inverting input;
   a mirroring circuit adapted for sensing current flowing through the P-channel input stage and mirroring a portion of the sensed current; and
   a threshold voltage reduction circuit adapted for reducing the threshold voltage of the P-channel input stage in proportion to the mirrored current.

2. The rail-to-rail op amp as recited in claim 1, wherein the set of P-channel MOS transistors includes a first P-channel MOS transistor and a second P-channel MOS transistor, the first and second P-channel MOS transistors being fabricated in an N-well substrate and having a gate, a source, and a drain, the mirroring circuit including:
   a first current mirroring transistor coupled to the first P-channel MOS transistor and being adapted for mirroring the current through the first P-channel MOS transistor;
   a second current mirroring transistor coupled to the second P-channel MOS transistor and being adapted for mirroring the current through the second P-channel MOS transistor;
   a P-channel input stage mirroring transistor coupled to the first and second current mirroring transistors and being adapted for summing the current through the first and second current mirroring transistors; and
   a bias transistor having an input coupled to the P-channel input stage mirroring transistor and an output coupled to the substrate of the first current mirroring transistor, the second current mirroring transistor, the first P-channel MOS transistor, and the second P-channel MOS transistor;
   wherein the threshold voltage reduction circuit is coupled to the substrate of the first current mirroring transistor, the second current mirroring transistor, the first P-channel MOS transistor, and the second P-channel MOS transistor.

3. The rail-to-rail op amp as recited in claim 2, wherein the first current mirroring transistor includes a gate coupled to the gate of the first P-channel MOS transistor and the second current mirroring transistor includes a gate coupled to the gate of the second P-channel MOS transistor, each of the current mirroring transistors being implemented as a P-channel MOS transistor.

4. The rail-to-rail op amp as recited in claim 2, wherein the P-channel input stage mirroring transistor is implemented as an N-channel MOS transistor.

5. The rail-to-rail op amp as recited in claim 2, wherein the bias transistor is implemented as an N-channel MOS transistor.

6. The rail-to-rail op amp as recited in claim 2, wherein the bias transistor is a fraction of the size of the P-channel input stage mirroring transistor.

7. The rail-to-rail op amp as recited in claim 6, wherein the bias transistor has a size approximately one-fifth of the P-channel input stage mirroring transistor.

8. The rail-to-rail op amp as recited in claim 1, wherein the P-channel input stage functions at a supply voltage proportional to the threshold voltage of the P-channel input stage.

9. The rail-to-rail op amp as recited in claim 1, wherein the threshold voltage reduction circuit provides a reduced supply voltage at which the P-channel input stage and the N-channel input stage are operable, the supply voltage being determined in part by the threshold voltage for the P-channel input stage and a threshold voltage for the N-channel input stage.

10. The rail-to-rail op amp as recited in claim 1, wherein the threshold voltage reduction circuit creates a negative substrate-source voltage for the P-channel input stage that is proportional to the mirrored current.

11. The rail-to-rail op amp as recited in claim 10, wherein the threshold voltage reduction circuit ensures that current through the substrate is proportional to the current flowing through the P-channel input stage.

12. The rail-to-rail op amp as recited in claim 10, wherein the negative substrate-source voltage is created through modifying a voltage at the substrate.

13. The rail-to-rail op amp as recited in claim 12, wherein the threshold voltage reduction circuit is adapted for modifying the voltage at the substrate in a non-linear manner during common mode operation of the op amp.

14. The rail-to-rail op amp as recited in claim 12, wherein current through the substrate is reduced through increasing the voltage at the substrate when current through the P-channel input stage decreases.

15. The rail-to-rail op amp as recited in claim 12, wherein current through the substrate is reduced through increasing the voltage at the substrate when both inputs of the op amp increase in voltage.

16. The rail-to-rail op amp as recited in claim 12, wherein the threshold voltage reduction circuit is adapted for connecting to a supply voltage and the substrate, the threshold voltage reduction circuit being adapted for creating a voltage of between approximately 0 volts and approximately 0.7 volts.

17. The rail-to-rail op amp as recited in claim 1, wherein the threshold voltage reduction circuit is implemented as a bipolar NPN transistor and a base-emitter voltage across the bipolar NPN transistor is reduced in proportion to the mirrored current.

18. The rail-to-rail op amp as recited in claim 17, wherein the base-emitter voltage across the bipolar NPN transistor fluctuates in a non-linear manner during common mode operation of the op amp.

19. A method for providing a rail-to-rail op amp, comprising:

providing a P-channel input stage including a set of P-channel MOS transistors;

providing an N-channel input stage including a set of N-channel MOS transistors, the set of N-channel MOS transistors and the set of P-channel MOS transistors being capable of connecting to an inverting input and a non-inverting input;

sensing current flowing through the P-channel input stage and mirroring a portion of the sensed current; and reducing the threshold voltage of the P-channel input stage in proportion to the mirrored current.

20. The method as recited in claim 19, wherein the P-channel input stage functions at a supply voltage proportional to the threshold voltage of the P-channel input stage.

21. The method as recited in claim 19, further including:

reducing a supply voltage at which the P-channel input stage and the N-channel input stage are operable, the supply voltage being determined in part by the reduced threshold voltage of the P-channel input stage.

22. The method as recited in claim 19, wherein reducing the threshold voltage further includes:

creating a negative substrate-source voltage for the P-channel input stage that is proportional to the mirrored current.

23. The method as recited in claim 22, wherein creating a negative substrate-source voltage includes:

ensuring that current through the substrate is proportional to the current flowing through the P-channel input stage.

24. The method as recited in claim 22, wherein creating a negative substrate-source voltage includes:

modifying a voltage at the substrate.

25. The method as recited in claim 24, wherein modifying the voltage at the substrate includes adjusting the voltage at the substrate in a non-linear manner during common mode operation of the op amp.

26. The method as recited in claim 24, wherein modifying the voltage at the substrate includes:

increasing the voltage at the substrate when current through the P-channel input stage decreases, thereby reducing current in the substrate.

27. The method as recited in claim 24, further including:

reducing current through the substrate by increasing the voltage at the substrate when both inputs of the op amp increase in voltage.

28. The method as recited in claim 24, wherein modifying the voltage includes:

creating a voltage of between approximately 0 volts and approximately 0.7 volts between a supply voltage and the substrate in a non-linear proportion to the mirrored current.

* * * * *

UNITED STATES PATENT AND TRADEMARK OFFICE
CERTIFICATE OF CORRECTION

PATENT NO. : 6,031,423
DATED : February 29, 2000
INVENTOR(S) : Sudip Basu

It is certified that error appears in the above-identified patent and that said Letters Patent are hereby corrected as shown below:

1. Column 8, line 40, change "21" to --2l--.

2. Column 5, line 9, change "while source" to --while the source--.

Signed and Sealed this

Fifteenth Day of May, 2001

Attest:

NICHOLAS P. GODICI

Attesting Officer

Acting Director of the United States Patent and Trademark Office